United States Patent [19]
Willer et al.

[11] Patent Number: 6,033,534
[45] Date of Patent: Mar. 7, 2000

[54] METHOD FOR PRODUCING AN AL-CONTAINING LAYER WITH A PLANAR SURFACE ON A SUBSTRATE HAVING HOLE STRUCTURES WITH A HIGH ASPECT RATIO IN THE SURFACE

[75] Inventors: Josef Willer, Riemerling; Hermann Wendt, Neukeferloh; Volker Lehmann, Munich, all of Germany

[73] Assignee: Siemens Aktiengesellschaft, Munich, Germany

[21] Appl. No.: 08/054,200

[22] Filed: Apr. 30, 1993

[30] Foreign Application Priority Data

May 20, 1992 [DE] Germany .............................. 42 16 715

[51] Int. Cl.[7] ................................................... C23C 14/34
[52] U.S. Cl. .................................. 204/192.15; 204/192.12
[58] Field of Search ........................ 204/192.12, 192.15, 204/192.17, 192.3, 298.09, 129.1, 129.3; 437/190, 194; 438/652, 653, 656, 685

[56] References Cited

U.S. PATENT DOCUMENTS

| | | | |
|---|---|---|---|
| 4,409,075 | 10/1983 | Kolbesen | 204/129.3 |
| 4,756,810 | 7/1988 | Lamont, Jr. et al. | 204/192.32 X |
| 4,874,484 | 10/1989 | Froell et al. | 204/129.3 |
| 4,994,162 | 2/1991 | Armstrong et al. | 204/129.3 X |
| 5,093,710 | 3/1992 | Higuchi | 437/194 X |
| 5,108,570 | 4/1992 | Wang | 204/192.15 X |
| 5,162,262 | 11/1992 | Ajika et al. | 437/190 X |
| 5,171,412 | 12/1992 | Talieh et al. | 204/192.15 |
| 5,209,833 | 5/1993 | Froell et al. | 204/129.3 X |

FOREIGN PATENT DOCUMENTS

| | | |
|---|---|---|
| 0296348 | 12/1988 | European Pat. Off. . |
| 0376709 | 7/1990 | European Pat. Off. . |
| 0 430 403 | 6/1991 | European Pat. Off. . |
| 0 485 130 | 5/1992 | European Pat. Off. . |
| 63-219819 | 3/1990 | Japan . |

OTHER PUBLICATIONS

Proc. of Int. IEEE VLSI Multilevel Interconnection Conf. 5 (1988) pp. 76–84.

L.D. Hartsough et al, "Aluminimum and Aluminimum Alloy Sputter Deposition for VLSI", Solid State Technology, pp. 66–72.

Proceedings of Teh Third International IEEE VLSI Multilevel Interconnection Conference, Jun. 9, 1986, Section 212–218.

*Primary Examiner*—Nam Nguyen
*Attorney, Agent, or Firm*—Hill & Simpson

[57] ABSTRACT

A method for producing an Al-containing layer having a planar surface onto a substrate having hole structures with high aspect ratios formed in the surface of the substrate, wherein the Al-containing layer is applied in a sputtering process during which the substrate is held at an elevated temperature and the sputtering process is implemented at a pressure between $1.3 \times 10^{-2}$ Pa and 13 Pa and at a low partial gas pressure. The substrate can be held at a temperature between approximately 400° C. and 500° C. during the sputtering process. A partial residual gas pressure of less than $1.3 \times 10^{-5}$ PA can prevail in the vacuum. An intermediate layer of pure titanium and a barrier layer of TiN can be directly deposited onto the substrate and the Al-containing layer can then be applied onto this intermediate end barrier layer.

23 Claims, 1 Drawing Sheet

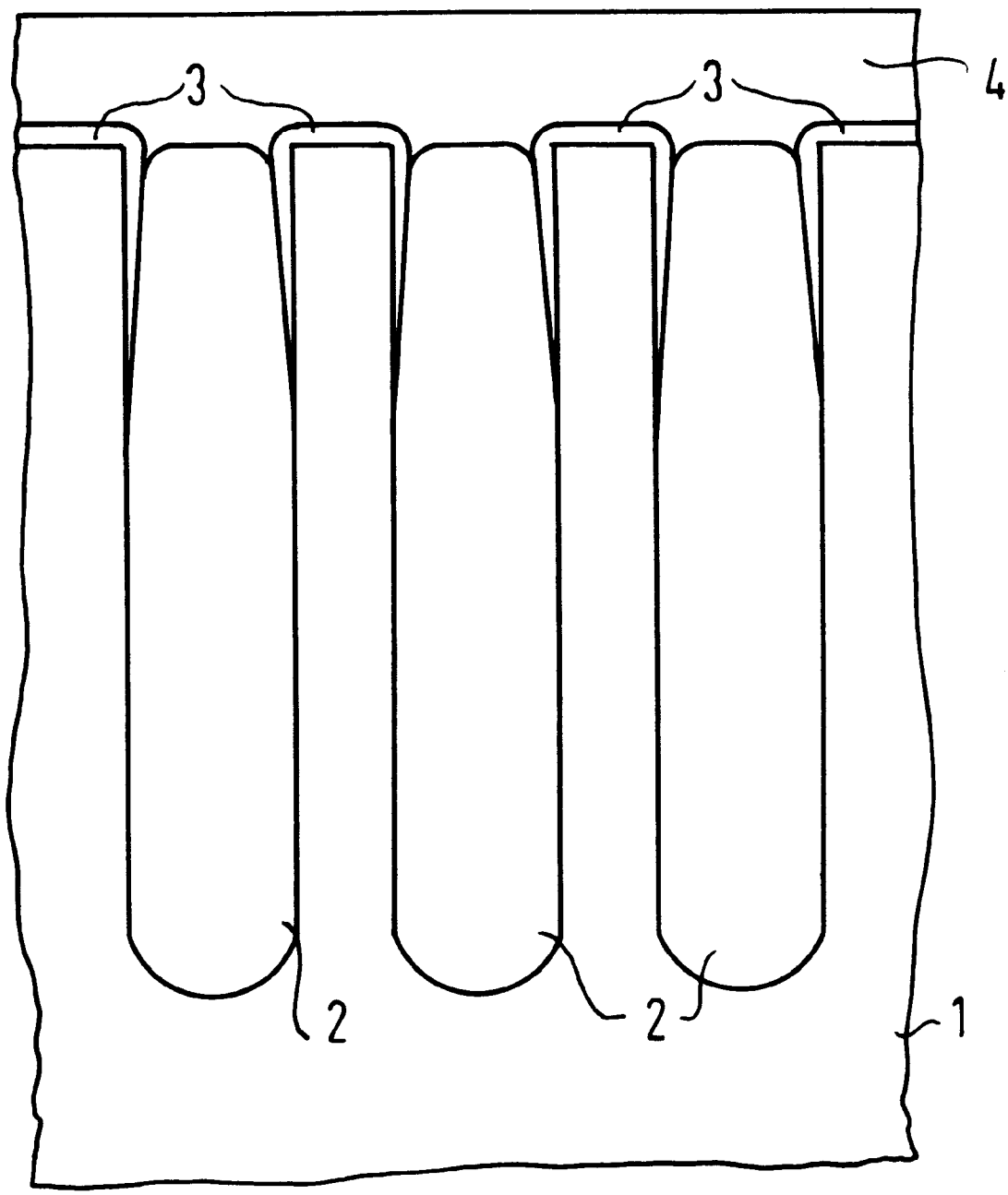

METHOD FOR PRODUCING AN AL-CONTAINING LAYER WITH A PLANAR SURFACE ON A SUBSTRATE HAVING HOLE STRUCTURES WITH A HIGH ASPECT RATIO IN THE SURFACE

BACKGROUND OF THE INVENTION

The invention is directed to a method for producing an Al-containing layer with a planar surface on a substrate having hole structures with a high aspect ratio in the surface.

What is understood by aspect ratio is the quotient of depth/diameter of a hole structure.

It is necessary for various applications to produce layers at the surface of substrates having hole structures with a high aspect ratio in the surface that close the hole structures and that have a planar surface. Hole structures with a high aspect ratio, i.e., with an aspect ratio of at least 10, particularly 50 through 200, cannot be filled up in sputtering methods. The only thing possible is to generate a layer at the surface that closes the hole structures. It is necessary to produce a planar Al-containing layer particularly for contacting components arranged in such substrates. This layer must be planar in order to be compatible with standard connecting technology such as, for example, wire-bonding.

Al-containing layers are generally deposited by vapor-deposition or sputtering. In order to produce barrier-free, low-impedance contacts on silicon semi-conductor materials, the substrates to be contacted are provided with a titanium coat and with a TiN diffusion barrier. The Al-containing layer is deposited thereon.

The literature, for example, Proceedings of the International IEEE VLSI Multilevel Interconnection Conference 5 (1988), pages 76–84; JP 2-68 926 (A); EP 0 485 130 A2; and EP 0 430 403 A2 discloses that via holes be filled up so that the fill has a planar surface. Via holes have aspect ratios of approximately 1, at most 5. Further, the sidewall of the via hole is composed of an insulator. The goal when filling via holes is to completely fill the via hole with conductive material in order to assure a flow of current from the floor of the via hole to the surface of the via hole fill with an optimally low-impedance conductor. The effect of wetting plays a significant part in the via hole filling. To that end, a titanium-containing layer is applied to the floor and to the sidewall of the via hole. A Ti—Al reaction occurs between the titanium-containing layer and the deposited aluminum, this reaction activating the adhesion forces. The adhesion forces exceed the cohesion of the aluminum. The aluminum atoms are thus drawn to the floor of the via hole coated with the titanium-containing layer.

When an Al-containing layer is deposited by vapor-deposition or sputtering on a substrate having hole structures with a high aspect ratio in the surface, then the hole structures are not closed given layer thicknesses up to 5 $\mu$m, even when their diameter is less than 2 $\mu$m. The aluminum-containing layer deposits on the partitions between the hole structures. As a result, the cylinder openings of the hole structures taper with increasing layer thickness. However, layer thicknesses considerably greater than 5 $\mu$m are required for closing the hole structures. A closed, planar surface cannot be achieved in this way given layer thicknesses of 1 $\mu$m through 3 $\mu$m.

SUMMARY OF THE INVENTION

It is therefore the object of the invention to specify a method for producing a planar Al-containing layer on a substrate having hole structures at the surface with which a planar surface is achieved even given layer thicknesses of approximately 1 $\mu$m through 3 $\mu$m.

The object is inventively achieved by a method for producing an Al-containing layer having a planar surface onto a substrate having hole structures with a high aspect ratio in the surface of the substrate, whereby the Al-containing layer is deposited on the surface of the substrate in a sputtering process, spanning the hole structures whereby the substrate is held at elevated temperature; whereby the sputtering process is implemented at a pressure between $1.3 \times 10^{-2}$ Pa and 13 Pa and a low partial residual gas pressure.

What is understood by the term "thigh aspect ratio" is an aspect ratio of at least 10. The method of the invention can be employed with particular advantage for aspect ratios between 50 and 200 and hole diameters between 0.1 and 2 $\mu$m.

Aluminum-containing layers can be produced on the substrates that have hole structures with a high aspect ratio with the method of the invention. These hole structures are not required for the contact that is realized by the aluminum-containing layers. These hole structures, however, can be unavoidable or indispensable for process-oriented or use-specific reasons.

This is particularly true of monocrystalline silicon substrates whose surface is enlarged by electrochemical etching in a fluoride-containing, acidic electrolyte.

When the surface of the hole structure is conductive because, for example, it is composed of doped silicon or doped polysilicon, then it is adequate for producing a contact layer to produce a planar, continuous aluminum-containing layer that closes the hole apertures of the hole structure. Given high aspect ratios, a filling of the holes is not practical since the holes are effectively infinitely deep for the deposition process. A filling of the holes is also not required in this case since a flow of current across the surface of the hole structures to the aluminum-containing layer ensues.

The aluminum-containing layer is produced by sputtering in the method of the invention. During sputtering, a layer thickness dependent on the duration of the sputtering forms at the surface parallel to the expanse of the substrate, this layer thickness decreasing at the sidewalls of the hole structure perpendicular thereto as a consequence of the angular distribution of the incident atoms. It has been found that the atoms of the growing layer have an only inadequate surface mobility without additional measures, so that a hole does not grow shut because of the shadowing of the one edge by that lying opposite. It is only at the elevated temperature that the deposition of the aluminum-containing layer of the invention ensues and an intensified atom mobility occurs in the growing layer, so that the surface thickness is minimized as a consequence of the layer growing together over the holes. A closed, planar surface derives in this way in the method of the invention even given a low layer thickness of 1 through 3 $\mu$m for the aluminum-containing layer.

The surface mobility of the aluminum-coating layer is increased as a consequence of the elevated substrate temperature and of the low partial pressure of the residual gas during deposition of the aluminum-containing layer. This enables a minimization of the surface energy, so that the hole apertures can close. This mechanism particularly functions when the cohesion forces within the aluminum-containing layer exceed the adhesion forces relative to the substrate.

The substrate is preferably held at a temperature between approximately 400° C. and 500° C. during the deposition of the aluminum-containing layer. A tempering step at a temperature on this order of magnitude is usually required following the layer deposition in known methods for producing aluminum-containing layers. Sputtering at a substrate temperature of approximately 400–500° C. therefore does not mean any additional temperature stress for the structure. The subsequent tempering step, however, can be eliminated in the method of the invention. This represents a simplification of the process execution.

It lies within the framework of the invention that a partial residual gas pressure of less than $1.3 \times 10^{-5}$ Pa ($10^{-7}$ Torr) prevails in the vacuum. Since the particle mobility increases with decreasing residual gas constituent, the necessary substrate temperature in the deposition of the aluminum-containing layer can be lowered somewhat using an extremely good vacuum, for example, as in a UHV sputtering system. It is advantageous to employ an optimally low substrate temperature for deposition of the aluminum-containing layer, particularly when the substrate comprises monocrystalline or polycrystalline silicon at the surface, since a more pronounced spike formation of the aluminum on the silicon substrate occurs at higher temperatures.

It lies within the framework of the invention to first deposit an intermediate layer of titanium on the substrate and a barrier layer of TiN onto which the aluminum-containing layer is deposited. The intermediate layer and the barrier layer prevent the unwanted spiking of the aluminum on the silicon substrate that can lead to the outage of components. The intermediate layer and the barrier layer are thereby deposited on the partitions between the hole structures, but not forming a continuous layer. As a consequence of the high aspect ratio of the hole structures, the intermediate layer and the barrier layer cannot be deposited on the entire surface of the hole structures. The floor and the majority part, particularly the lower region of the partitions of the hole structures remain free of the intermediate layer and of the barrier layer. However, the intermediate layer and the barrier layer prevent the direct contact of aluminum and silicon.

The method can be particularly advantageously utilized for producing a contact for a capacitor that is realized in a silicon substrate whose surface is enlarged by electrochemical etching in a fluoride-containing, acidic electrolyte in which the substrate is connected as anode and on whose enlarged surface a dielectric layer and a doped polysilicon layer are arranged as cooperating electrode. The surface of the silicon substrate has hole structures having an aspect ratio up to 1:1000 that also transfer onto the surface of the doped polisilicon layer. In this case, an aluminum-containing contact that has a closed planar surface and that, for example, is compatible with wire-bonding methods must be produced for contacting the doped polysilicon layer. This contact can be produced by producing a planar, aluminum-containing layer according to the manufacturing method of the invention and by structuring this layer. The contact thereby becomes planar but nonetheless thin and is therefore produced in a cost-beneficial way.

A further advantage of the method of the invention is that the hole structure is closed and thus covered by the aluminum-containing layer. The hole structure is protected by this covering during assembly and during the further manufacturing process.

The closed, planar, aluminum-containing layer can be structured, for example as a contact, in subsequent, manufacturing steps. Following such a structuring, the aluminum-containing layer can be employed as etching mask for later etchings. The method, for example, for manufacturing a contact for the capacitor, can be advantageously utilized for structuring the doped polysilicon layer. By applying the completely structured contact that comprises a closed, planar surface as etching mask, difficulties that would arise in the manufacture of a photoresist mask on the surface of the substrate having the hole structures are avoided when structuring the doped polysilicon layer.

Another advantage of the method of the invention is comprised therein that the layer deposition is possible with cost-beneficial, production-tested DC-magnetron sputtering. The method of the invention is suitable both for pure aluminum layers as well as for diluted aluminum alloys that are resistant to electromigration, for example aluminum having one weight percent of silicon and 0.5 weight percent Cu.

In a further development in the method of the invention, the hole structures have an aspect ratio in the range between 50 and 200. The hole structures can be electrically conductive. The substrate can be held at a temperature between approximately 400° C. and 500° C. during the deposition of the Al-containing layer. During the sputtering process, a partial residual gas pressure of less than $1.3 \times 10^{-5}$ Pa can prevail in the vacuum. The Al-containing layer can be produced by DC-magnetron sputtering. The substrate can comprise silicon at the surface. An intermediate layer of pure titanium and a barrier layer of TiN onto which the aluminum containing layer is deposited can be first deposited onto the substrate. The intermediate layer can be deposited in a thickness between 20 and 30 nm and the barrier layer is deposited in a thickness between 100 and 150 nm at a substrate temperature between 200° C. and 400° C.

The method can be employed for producing an Al-containing layer having a planar surface on the surface of a n-doped silicon substrate in which hole structures are produced by electrochemical etching in a flouride-containing, acidic electrolyte in which the silicon substrate is connected as anode and as whereby the Al-containing layer is deposited on the surface of the silicon substrate containing the hole structures in a sputtering process. The substrate can be held at an elevated temperature and the sputtering process can be implemented at a pressure between $1.3 \times 10^{-2}$ Pa and 13 Pa at a low partial residual gas pressure.

The method of the invention can be employed for producing an Al-containing layer with a planar surface as a contact for a cooperating electrode of a capacitor that comprises an n-doped silicon substrate in whose surface hole structures are produced by electrochemical etching in a flouride-containing, acidic electrolyte wherein the silicon substrate is connected as anode, comprising a dielectric layer that is arranged at the surface of the hole structures, and comprising a doped polysilicon layer as a cooperating electrode that is arranged at the surface of the dielectric layer and whose surface exhibits the form of the hole structures and whereby the Al-containing layer is deposited on the surface of the doped polysilicon layer containing the hole structures in a sputtering process. The substrate can have the dielectric layer and the doped polysilicon layer held at elevated temperatures. The sputtering process can be implemented at a pressure between $1.3 \times 10^{-2}$ Pa and 13 Pa and a low partial residual gas pressure.

The invention shall be set forth in greater detail below with reference to the figure and to an exemplary embodiment.

BRIEF DESCRIPTION OF THE DRAWING

The FIGURE is a sectional view of a substrate having a hole structure at whose surface a planar, Al-containing layer is produced.

DETAILED DESCRIPTION OF THE PREFERRED EMBODIMENTS

A substrate 1 that, for example, is n-doped and that contains monocrystalline silicon is provided with hole structures 2. For example, the hole structures 2 are produced by electrochemical etching in a fluoride-containing, acidic electrolyte in which the substrate 1 is connected as anode. The hole structures 2 have an aspect ratio of, for example, 1:100. A dielectric layer can be arranged at the surface of the hole structures 2 and a doped polysilicon layer can be arranged on this dielectric layer (not shown).

A layer sequence 3 of pure titanium having a thickness of, for example, 20 through 30 nm and of TiN having a thickness of, for example, 100 through 150 nm is produced by reactive sputtering at a temperature of the substrate 1 of, for example, 200 through 400° C. The Ti/TiN precipitates on the partitions arranged between the hole structures. It tapers the cylindrical hole structures 2 toward their upper end. The layer sequence 3, however, does not form a continuous layer that closes the hole structures 2.

An aluminum-containing layer 4 is deposited in a sputtering process at a substrate temperature of, for example, 400 through 500° C. in a vacuum having a partial residual gas pressure of less than $1.3 \times 10^{-5}$ Pa ($10^{-7}$ Torr) given a pressure of, for example $1.3 \times 10^{-2}$ Pa through 13 Pa of the sputtering gas and a deposition rate of, for example, 1 μm per minute. A high surface mobility is assured under these process conditions, so that a continuous, planar layer forms. Given a layer of thickness of 1 μm through 3 μm, the Al-containing layer 4 completely closes the hole structures 2 that have a diameter of, for example, 0.5 through 2 μm. The Al-containing layer 4 is separated from the silicon of the substrate 1 by the layer sequence 3 of Ti/TiN. A formation of spiking between the aluminum and the silicon is thus avoided.

Although other modifications and changes may be suggested by those skilled in the art, it is the intention of the inventors to embody within the patent warranted hereon all changes and modifications as reasonably and properly come within the scope of their contribution to the art.

We claim as our invention:

1. A method for producing an Al-containing layer having a planar surface, onto a substrate having hole structures formed on a surface thereof, the hole structures having a high aspect ratio, comprising the steps of:

using a sputtering process, depositing an Al-containing layer to close said hole structures at said surface without filling a lower region of said hole structures;

holding said substrate at an elevated temperature; and implementing said sputtering process at a pressure between $1.3 \times 10^{-2}$ Pa and 13 Pa and at a low partial residual gas pressure.

2. A method according to claim 1, wherein said step of depositing is further characterized in that said hole structures have an aspect ratio in the range between 50 and 200.

3. A method according to claim 1, wherein said step of depositing is further characterized in that the surface of the hole structures is electrically conductive.

4. A method according to claim 1, wherein said step of holding said substrate at an elevated temperature is further characterized in that said temperature is held between approximately 400° C. and 500° C. during the deposition of the Al-containing layer.

5. A method according to claim 1, wherein said step of implementing said sputtering process is further characterized in that said low partial residual gas pressure is less than $1.3 \times 10^{-5}$ Pa in the vacuum.

6. A method according to claim 1, wherein said step of depositing said Al-containing layer is further characterized in that said sputtering process is produced by DC-magnetron sputtering.

7. A method according to claim 1, further characterized in that the substrate comprises silicon at said surface of said substrate.

8. A method according to claim 1, comprising the further step of, before depositing said Al-containing layer onto said substrate, depositing an intermediate layer of titanium and a barrier layer of TiN onto said substrate.

9. A method according to claim 8, wherein said step of depositing said intermediate layer and said barrier layer are further characterized in that said intermediate layer is deposited in a thickness between 20 and 30 nm and the barrier layer is deposited in a thickness between 100 and 150 nm at a substrate temperature between 200 and 400° C.

10. A method for producing an Al-containing layer having a planar surface onto a surface of an n-doped silicon substrate in which hole structures are formed by electrochemical etching in a fluoride-containing, acidic electrolyte in which the silicon substrate is connected as anode, comprising the steps of:

using a sputtering process, depositing an Al-containing layer on the surface of the silicon substrate which contains the hole structures, to close said hole structures at said surface without filling a lower region of said hole structures while the substrate is held at an elevated temperature;

implementing the sputtering process at a pressure between $1.3 \times 10^{-2}$ Pa and 13 Pa and a low partial residual gas pressure.

11. A method according to claim 10, further characterized in that the hole structures have an aspect ratio in the range between 50 and 200.

12. A method according to claim 10, further characterized in that said elevated temperature is between 400° C. and 500° C. during the deposition of the Al-containing layer.

13. A method according to claim 10, further characterized in that said partial residual gas pressure is less than $1.3 \times 10^{-5}$ Pa in the vacuum.

14. A method according to claim 10, further characterized in that the sputtering process is DC-magnetron sputtering.

15. A method according to claim 10, comprising the further steps of, before depositing said Al-containing layer onto said substrate, depositing an intermediate layer of titanium and a barrier layer of TiN onto said substrate.

16. A method according to claim 15, wherein said step of depositing said intermediate layer and said barrier layer are further characterized in that said intermediate layer is deposited in a thickness between 20 and 30 nm and the barrier layer is deposited in a thickness between 100 and 150 nm at a substrate temperature between 200 and 400° C.

17. A method for producing an Al-containing layer having a planar surface acting as a contact for a cooperating electrode of a capacitor that comprises an n-doped silicon substrate having a surface hole structure produced by electrochemical etching in a fluoride-containing, acidic electrolyte wherein the silicon substrate is connected as anode, comprising a dielectric layer that is arranged at the surface of the hole structures, and comprising a doped polysilicon layer as cooperating electrode that is arranged at the surface of the dielectric layer and whose surface exhibits the form of the hole structures, comprising the steps of:

using a sputtering process, depositing an Al-containing layer on the surface of the doped polysilicon layer to close said hole structures without filling a lower region of said hole structures, the substrate having the dielectric layer and the doped polysilicon layer held at elevated temperatures;

impleamenting the sputtering process at a pressure between $1.3 \times 10^{-2}$ Pa and 13 Pa and a low partial residual gas pressure.

18. A method according to claim 17, wherein said step of depositing is further characterized in that said hole structures have an aspect ratio in the range between 50 and 200.

19. A method according to claim 17, further characterized in that the substrate with the dielectric layer and the doped polysilicon layer is held at a temperature between 400° C. and 500° C. during the deposition of the Al-containing layer.

20. A method according to claim 17, wherein said step of implementing said sputtering process is further characterized in that said low partial residual gas pressure is less than $1.3 \times 10^{-5}$ Pa in the vacuum.

21. A method according to claim 17, wherein said step of depositing said Al-containing layer is further characterized in that said sputtering process is produced by DC-magnetron sputtering.

22. A method according to claim 17, comprising the further steps of:

before depositing the Al-containing layer, depositing an intermediate layer of pure titanium and a barrier layer of TiN onto the doped polysilicon layer.

23. A method according to claim 22, wherein said step of depositing said intermediate layer and said barrier layer are further characterized in that said intermediate layer is deposited in a thickness between 20 and 30 nm and the barrier layer is deposited in a thickness between 100 and 150 nm at a substrate temperature between 200 and 400° C.

* * * * *